United States Patent [19]

Takahama

[11] 4,346,447
[45] Aug. 24, 1982

[54] DIVISIONAL READING DEVICE FOR SINE SIGNALS

[75] Inventor: Akio Takahama, Kawasaki, Japan

[73] Assignee: Nippon Kogaku K.K., Tokyo, Japan

[21] Appl. No.: 160,534

[22] Filed: Jun. 18, 1980

[30] Foreign Application Priority Data

Dec. 28, 1979 [JP] Japan .................................. 54-172199
Dec. 28, 1979 [JP] Japan .................................. 54-172200
Feb. 25, 1980 [JP] Japan .................................. 55-21586

[51] Int. Cl.³ .......................... G06J 1/00; G06G 7/22; G01D 5/34
[52] U.S. Cl. .............................. 364/560; 250/231 SE; 340/347 P; 364/603; 364/606; 364/817
[58] Field of Search ............... 364/603, 606, 817, 818, 364/850, 550, 551, 560–563; 250/231 SE, 233, 237 R; 340/347 SY, 347 P

[56] References Cited

U.S. PATENT DOCUMENTS

| 3,267,271 | 8/1966 | Kindle et al. | 364/817 |
| 3,388,262 | 6/1968 | Stutz | 340/347 P X |
| 3,449,588 | 6/1969 | Foskett | 250/231 SE |
| 3,648,041 | 3/1972 | Beatrice | 364/817 |
| 3,651,513 | 3/1972 | Meyer et al. | 364/603 X |
| 3,671,729 | 6/1972 | Lux | 364/817 X |
| 3,825,737 | 7/1974 | Croisier | 364/603 |

Primary Examiner—Joseph F. Ruggiero
Attorney, Agent, or Firm—Shapiro and Shapiro

[57] ABSTRACT

A device for dividing two sine signals out of phase with each other obtained from a detector in accordance with a position change and to enable a greater resolution and accuracy in the determination of displacement comprises a division circuit connected to the detector to provide an output representative of the ratio of the two sine signals, and conversion means for causing the output of the division circuit to correspond to a displacement.

9 Claims, 34 Drawing Figures

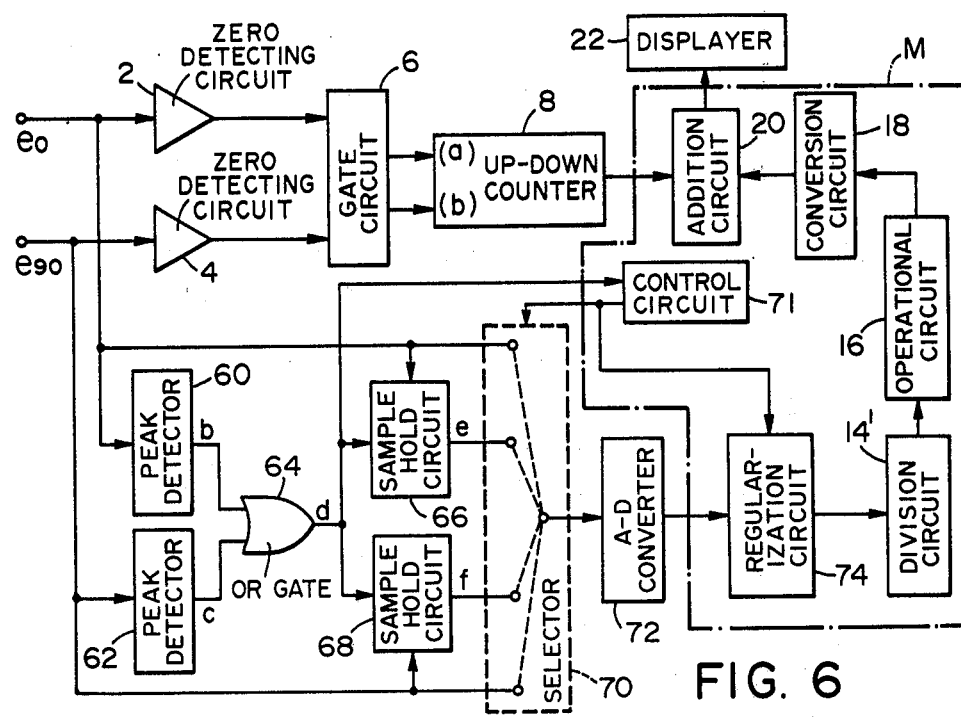
FIG. 6
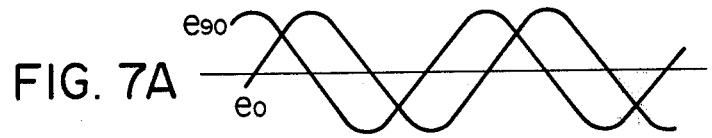
FIG. 7A
FIG. 7B
FIG. 7C
FIG. 7D
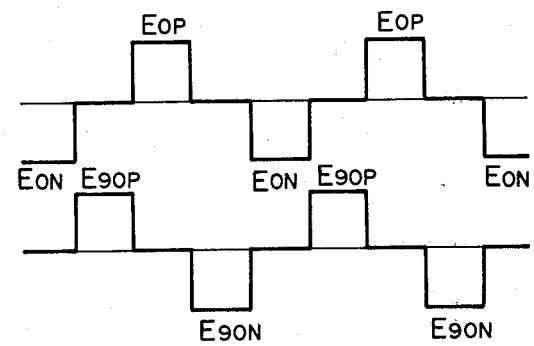
FIG. 7E
FIG. 7F

DIVISIONAL READING DEVICE FOR SINE SIGNALS

BACKGROUND OF THE INVENTION

1. Field of the Invention

This invention relates to a device for use with an apparatus such as a position encoder, a laser interferometer or the like in which a detector outputs two sine signals out of phase with each other in accordance with a position change (generally, the signals from said detector are not pure sine signals but are quasi-sine signals, whereas herein signals including such quasi-sine signals are referred (to as sine signals) to indicate the amount and direction of displacement. The device forms the ratio of the sine signals to enable greater resolution and accuracy in the determination of displacement.

2. Description of the Prior Art

A device for dividing and for reading out the signals from a position encoder is known in which two sine signals, out of phase with each other by 90°, obtained from a detector are applied to a resistor array to thereby form sine signals of various phases, and all the zero crossing points of these signals are counted.

However, such conventional divisional reading device has required a great number of divisions and thus a large number of zero detecting circuits, and this has led to a disadvantage that the circuit construction thereof becomes complex.

The conventional device has also suffered from the disadvantage that the accuracy of division is poor due to the amplitude fluctuations or the like of the two sine signals.

A further disadvantage of the conventional device is that the accuracy of division is poor due to the so-called phase fluctuation of the two sine signals which is the deviation of the phase difference therebetween from 90° resulting from temperature changes or the like.

SUMMARY OF THE INVENTION

It is a first object of the present invention to provide a divisional reading device which is simple in circuit construction.

It is a second object of the present invention to provide a device which can effect divisional reading having high accuracy and free of the influence of amplitude fluctuations of signals, by a simple construction.

It is a third object of the present invention to provide a device which can effect divisional reading having high accuracy without being affected by phase fluctuations of signals, by a simple construction.

The invention will become fully apparent from the following detailed description of some embodiments thereof taken in conjunction with the accompanying drawings.

BRIEF DESCRIPTION OF THE DRAWINGS

FIGS. 3A–3I are the waveform diagrams for illustrating a certain reading error occurring in the circuit of FIG. 1.

FIG. 6 is a block diagram showing a third embodiment of the device according to the present invention which can effect divisional reading accurately even when sine signals out of phase with each other by 90° create amplitude fluctuations.

FIGS. 7A–7F illustrate the waveforms appearing in various portions of the block diagram of FIG. 6.

DESCRIPTION OF THE PREFERRED EMBODIMENTS

In the following embodiments, to proceed with the discussion concretely, description will be made of an example in which the divisional reading device of the present invention as applied to a linear encoder for measuring displacement. The linear encoder is usually designed to provide two sine voltages 90° out of phase with each other at the output of a detector to enable the direction of movement to be determined.

Figure 1:
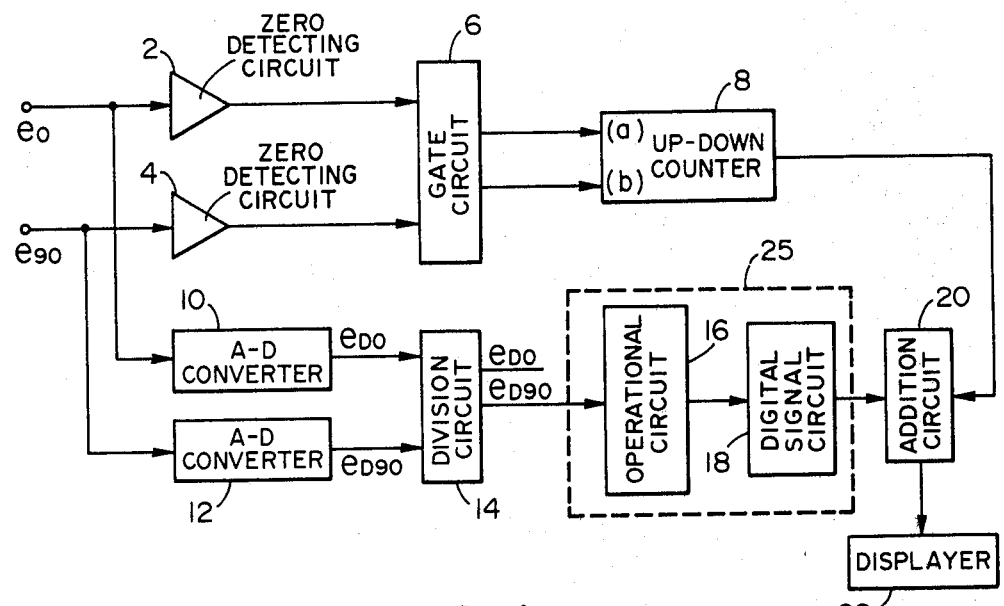
FIG. 1 is a block diagram showing a first embodiment of the device according to the present invention.

In FIG. 1, zero detecting circuits 2 and 4 receive as inputs two sine voltages $e_0$ and $e_{90}$ obtained from the aforementioned detector ($e_{90}$ is a sine voltage which is advanced by 90° in phase with respect to $e_0$) and waveform-shape such voltages into rectangular voltages with 0 volts as the standard. A gate circuit 6 forms a pulse at the rising and falling edges of the rectangular voltage corresponding to the voltage $e_0$ and discriminates the direction of movement of a main scale of the encoder from the relation between the two rectangular voltages corresponding to the voltages $e_0$ and $e_{90}$. That is, when the main scale moves in the positive direction, the gate circuit 6 outputs pulses to a terminal connected to the up input (a) of an up-down counter 8 and, when the main scale moves in the reverse direction, the gate circuit 6 outputs pulses to a terminal connected to the down input (b) of the up-down counter 8. Accordingly, the number of pulses counted by the counter 8 corresponds to the displacement of the main scale from its initial position. Assuming that the design is such that one half period of the voltage corresponds to $1\mu$ (displacement unit) on the main scale, it will be seen from the count content n of the counter 8 that the displacement of the main scale is $n\mu$. Such a construction is well-known as the counting circuit of the conventional linear encoder.

Figure 2:
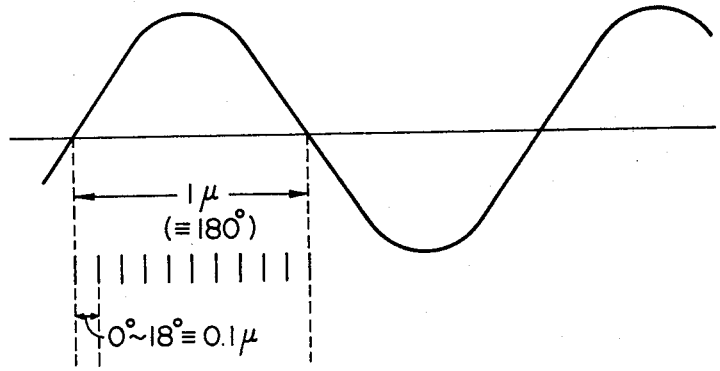
FIG. 2 is a waveform diagram for illustrating the manner in which a sine signal is divided by the device of the present invention.

In accordance with the invention, the sine voltages $e_0$ and $e_{90}$ are converted into digital signals $e_{D0}$ and $e_{D90}$ by A-D converters 10 and 12, respectively, and their ratio $e_{D0}/e_{D90}$ is formed and output by a division circuit 14. An operational circuit 16 performs the operation $\tan^{-1}(e_{D0}/e_{D90})$. A conversion circuit 18 outputs a signal corresponding to the value range of $\tan^{-1}(e_{D0}/e_{D90})$ in accordance with a preset rounding width depending on the number of ports, i.e., intervals, into which the one-half period (180°) of the sine voltage is divided. For example, where the one-half period (180°) is divided into ten equal parts as shown in FIG. 2, the rounding width becomes 18°. Accordingly, the conversion circuit 18 outputs a digital signal between corresponding to a particular 0-9 18° interval i.e., it outputs 0 when $\tan^{-1}(e_{D0}/e_{D90})$ is 0°-18°, it outputs 1 when $\tan^{-1}(e_{D0}/e_{D90})$ is 18°-36°, it outputs 2 when $\tan^{-1}e_{D0}/e_{D90})$ is 36°-54°, . . . . If the one-half period corresponds to $1\mu$, the order of the output signal of the conversion circuit 18 corresponds to $0.1\mu$, i.e., tenths of a displacement unit. An addition circuit 20 adds the output of the converting circuit 18 to the count content of the counter 8 and provides the sum as the drive signal for a displayer 22. Accordingly, if the output of the conversion circuit 18 is $m(0 \leq m \leq 9)$, $(n+0.1\ m)\mu$ will be displayed on the displayer 22. Thus, the reading accuracy is enhanced by tenths of a unit.

The operational circuit 16 and conversion circuit 18 may be replaced by a ROM (Read Only Memory) 25, as is indicated by broken lines in FIG. 1. That is, if the design is such that the ratio $e_{D0}/e_{D90}$ and the values 0-9 corresponding to said ratio are stored in mutually corresponding relationship in ROM 25, s shown in Table I (hereinafter), and the value from the division circuit 14 (ratio $e_{D0}/e_{D90}$) is used as the address designation data of the ROM 25, a divided value may be obtained without actually effecting an operation. Further, the design may of course be such that the ratio of the voltages $e_0$ and $e_{90}$ is obtained by an analog device, and the ratio is A-D-converted so that $e_{D0}/e_{D90}$ is obtained as the A-D-converted value.

In the above-described circuit construction, the circuits 2 and 4 for detecting the zero crossing points of the sine voltages $e_0$ and $e_{90}$ and the A-D converters 10 and 12 used for the divisional reading operate independently of each other. Therefore, if the amount of drift differs from one circuit to another, an error in the reading would occur at certain positions. The following is the description of means for overcoming such a disadvantage.

Figure 3A:
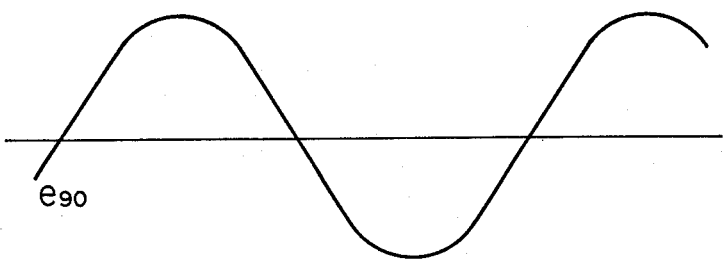
Figure 3B:
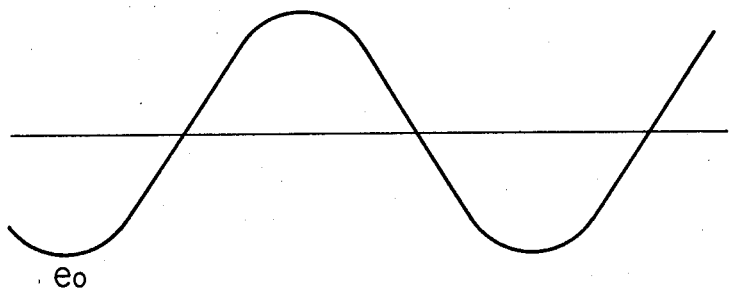
Figure 3C:
Figure 3D:
Figure 3E:
Figure 3F:
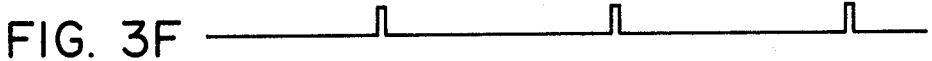
Figure 3G:

FIG. 3A shows the sine voltage $e_{90}$ and FIG. 3B shows the sine voltage $e_0$. FIG. 3C shows the rectangular voltage output of zero detecting circuit 4 produced by crossing points of the sine voltage $e_{90}$, and FIG. 3D shows the rectangular voltage output of zero detecting circuit 2 produced by the zero crossing points of the sine voltage $e_0$ FIGS. 3E and 3F shown pulses produced at the rising and falling edges of the voltage waveform of FIGS. 3C and 3D, respectively. FIG. 3G shows an assumed count value of the counter 8 of FIG. 1. FIGS. 3H and 3I illustrate the case where the one-half period of FIG. 3B is divided into ten parts, FIG. 3H showing an example of the value in a case where the reference position (the position changed from 9-0) is deviated leftwardly with respect to FIG. 3G, and FIG. 3I showing an example of the value in a case where the reference position (the position changed from 9-0) is deviated rightwardly with respect to FIG. 3G. That is, where the reading of the divided least significant bit (LSB) obtained from the sine voltages $e_0$ and $e_{90}$ is as shown in FIG. 3H, the entire reading is 9999 at position A, 9990 at position B and 0000 at position C. The reading 9990 at position B is a meaningless value. Also, where the reading of the divided least significant bit obtained from the sine voltages $e_0$ and $e_{90}$ is as shown in FIG. 3I, the entire reading is 9998 at position A, 9999 at position B and 0009 at position C. The reading 0009 at position C is a meaningless value. Accordingly, unless, with one of the readings of FIG. 3G and FIG. 3H (or FIG. 3I) as the reference, the value of the other is corrected, the meaning of the digital display would be lost.

Figure 4:
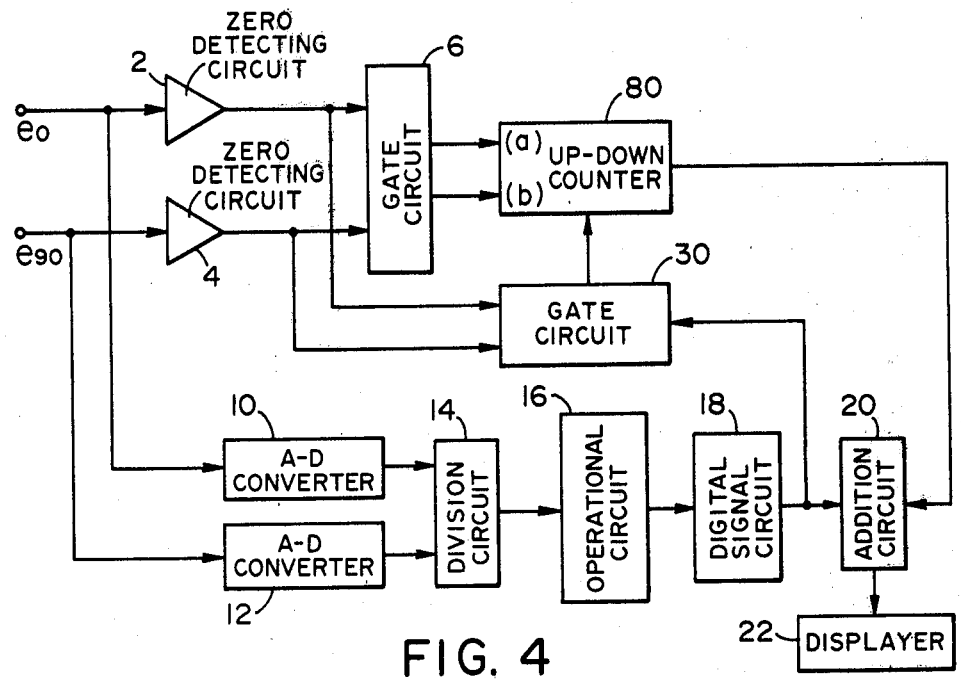
FIG. 4 is a block diagram showing a second embodiment of the present invention in which a reading error correcting circuit is added to the circuit of FIG. 1.
Figure 5:
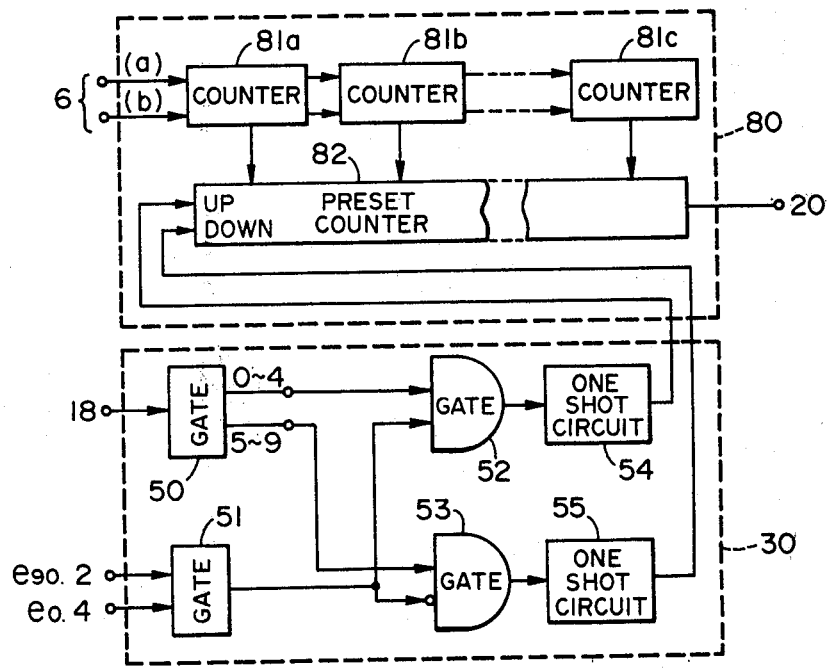
FIG. 5 is a block diagram showing the details of the blocks 30 and 80 of FIG. 4.

FIGS. 4 and 5 show an example in which the reading of FIG. 3G is corrected with that of FIG. 3H, namely, the values of the least significant unit, as the reference. The differences between the FIG. 4 circuit and the FIG. 1 circuit are that the function of the counter has been changed, as later described, and that a gate circuit 30 has been added. In other respects, the FIG. 4 circuit is similar to the FIG. 1 circuit and, therefore, the identical portions need not be described. The blocks 30 and 80 of FIG. 4 will be described in detail with reference to FIG. 5.

In FIG. 5, a gate 50 within the block 30 outputs an H (high level) signal at the upper output terminal when the output of the conversion circuit 18 is 0-4, and outputs an H signal at the lower output terminal when the output of the conversion circuit 18 is 5-9 A gate 51 is an exclusive logic sum gate which outputs an H signal only when the signal levels from the zero detecting circuits 2 and 4 differ from each other. A gate 52 receives as inputs the signals produced at the upper output terminal of the gate 50 and the output terminal of the gate 51, and outputs an H signal when its two input signals are H. A one shot circuit 54 outputs a pulse when the output of the gate 52 becomes H, which increases the count content of a preset counter 82 by one. On the other hand, a gate 53 receives as inputs the signals produced at the lower output terminal of the gate 50 and the output terminal of the gate 51, and outputs H signal when an H signal is produced at the lower output terminal of the gate 50 and when an (low level) signal is produced at the output terminal of the gate 51. A one shot circuit 55 outputs a pulse when the output of the gate 53 becomes H, which decreases the count content of the preset counter 82 by one. A counter 80 has counters 81a, 81b and 81c corresponding to the respective units(bits), and the pulses from the gate circuit 6 of FIG. 1 are successively counted by this counter 80. These counters 81a-81c correspond to the counter 8 of FIG. 1. The contents of these counters 81a, 81b and 81c are applied to the preset counter 82 in a parallel fashion. With such a construction, assume a case where, for example, at the position B of FIG. 3, the output of the conversion circuit 18 is 0 as shown in FIG. 3H. At this time, the counter 81a is counting 9, the counter 81b is counting 9 and the counter 81c is counting 9. Since the outputs of the zero detecting circuits 2 and 4 are L and H, respectively, the gate 51 outputs an H signal. On the other hand, since the output of the conversion circuit 18 is 0, the output to the upper terminal of the gate 50 becomes H and the output of the gate 52 becomes H. Accordingly, the preset counter 82 counts up and its count content becomes 000. Thus, in this case, the count value becomes 9999 at the position A of FIGS. 3, 0000 at the position B of FIG. 3 and also 0000 at the position C of FIG. 3, and the count value continues. Now assume a case where, for example, at the position C of FIG. 3, the output of the conversion circuit 18 is 9 as shown in FIG. 3I. At this time, the counter 81a is counting 0, the counter 81b is counting 0 and the counter 81c is counting 0. Since the outputs of the zero detecting circuits 2 and 4 are H and H, respectively, the gate 51 outputs an L signal. On the other hand, since the output of the conversion circuit 18 is 9, the output to the lower terminal of the gate 50 becomes H and the output of the gate 53 becomes H. Accordingly, the preset counter 82 counts down by one and its count content becomes 999. Thus, in this case, the count value becomes 9998 at the position A of FIG. 3, 9999 at the position B of FIG. 3 and also 9999 at the position C of FIG. 3, and the count value continues.

In this manner, a certain discontinuous value produced at the LSB position due to the error inherent in each circuit can be corrected in the state of reading.

The above-described embodiment is convenient in a case where the two sine signals $e_0$ and $e_{90}$ obtained from the detector have no amplitude fluctuations. However, in a measuring device, for example, an encoder, it is usually the case that the two signals $e_0$ and $e_{90}$ obtained have amplitude fluctuations due to irregularities in lattice spacing, cut lines of lattice, etc. Therefore, another embodiment designed to enable divisional reading to be accurately effected even if there are amplitude fluctuations in the two signals $e_0$ and $e_{90}$ will now be described with reference to the drawings. In this embodiment, elements identical to those in FIG. 1 are given similar reference numerals and need not be described.

In FIG. 6, the sine voltages $e_0$ and $e_{90}$ are applied to a selector 70 and also to peak detectors 60 and 62, respectively. The peak detector 60 generates a pulse at the peak position of the sine voltage $e_0$ as shown in FIG. 7B, and the peak detector 62 generates a pulse at the peak position of the sine voltage $e_{90}$ as shown in FIG. 7C. An OR gate 64 receives as inputs the pulses from the peak detectors 60 and 62 and alternately outputs the two input pulses as shown in FIG. 7D. Sample and hold circuits 66 and 68 are designed to hold the values of the sine voltages $e_0$ and $e_{90}$, respectively, synchronized with the pulse outputs of the OR gate 64, and the outputs thereof are such as shown in FIGS. 7E and 7F, respectively. The positive and negative maximum values of the sine voltage $e_0$ and $E_{OP}$ and $E_{ON}$, respectively, and the positive and negative maximum values of the sine voltage $e_{90}$ and $E_{90P}$ and $E_{90N}$, respectively.

The selector 70 applies successively to an A-D converter 72 the signals applied to its four terminals in accordance with the control signal from a control circuit 71. The control circuit 71 receives as inputs the pulses from OR gate 64 and prepares the control signal for the selector 70 following a predetermined procedure, in accordance with said pulses, and controls the selector 70. The A-D converter 72 A-D-converts the voltages $e_0$, $e_{90}$, $E_{OP}$, $E_{ON}$, $E_{90P}$ and $E_{90N}$ to digital signals $e_{D0}$, $E_{D90}$, $E_{DOP}$, $E_{DON}$, $E_{D90P}$, and $E_{D90N}$ corresponding to the magnitudes of the respective signals. These digital signals are successively applied to a regularization circuit 74. The regularization circuit 74 discriminates between the types of the applied digital signals by the control signal from the control circuit 71, regularizes the digital signals $e_{D0}$ and $e_{D90}$ by the operations of the following equations (1) and (2), and successively outputs regularized signals $e'_{D0}$ and $e'_{D90}$.

$$e'_{D0} = \frac{e_{D0} - \frac{E_{DOP} + E_{DON}}{2}}{\frac{E_{DOP} - E_{DON}}{2}} \quad (1)$$

$$e'_{D90} = \frac{e_{D90} - \frac{E_{D90P} - E_{D90N}}{2}}{\frac{E_{D90P} - E_{D90N}}{2}} \quad (2)$$

The signals $e'_{D0}$ and $e'_{D90}$ obtained by regularizing the digital signals $e_{D0}$ and $e_{D90}$ as described above are free of the influences of amplitude fluctuations of the sine voltages, drift of the circuit, etc. However, generally, the drift of the circuit can be corrected to some degree by the circuit itself and, therefore, in that case, equations (1) and (2) may be simplified into the following equations (1)' and (2)', respectively:

$$e'_{D0} = \frac{e_{D0}}{\frac{E_{DOP} - E_{DON}}{2}} \quad (1)'$$

$$e'_{D90} = \frac{e_{D90}}{\frac{E_{D90P} - E_{D90N}}{2}} \quad (2)'$$

The signals $e'_{D0}$ and $e'_{D90}$ obtained by the regularization circuit 74 are successively applied to a division circuit 14', where $e'_{D0}/e'_{D90}$ is calculated. The output $e'_{D0}/E'_{D90}$ of the division circuit 14' is applied to an operational circuit 16, where it is subjected to the operation $\tan^{-1}(e'_{D0}/e'_{D90})$ and the result is output. A conversion circuit 18 outputs a signal corresponding to $\tan^{-1}(e'_{D0}/e'_{D90})$ in accordance with the preset rounding width depending on the number of parts into which the one-half period (180°) of the sine voltage is divided. The operational circuit 16 and the conversion circuit 18 may be the same as those shown in FIG. 1.

Also, four memory circuits may be provided in the regularization circuit 74 and a circuit for detecting the frequencies of the voltages $e_0$ and $e_{90}$ may be provided in the control circuit 71, and the design may be made such that the control circuit 71 causes the average values of $E_{DOP}$, $E_{DON}$, $E_{D90P}$ and $E_{D90N}$ to be separately stored in said four memory circuits when the frequencies of the voltages $e_0$ and $e_{90}$ are high, and such that the regularization circuit 74 is controlled so as to effect regularization only when the frequencies of the voltages $e_0$ and $e_{90}$ have become small or when these voltages have become DC voltages (in the case of an encoder, the condition in which the main scale is stopped). Of course, the block M may be replaced by a computer.

As described with respect to the foregoing embodiment, in a linear encoder, there can usually be obtained sine voltages 90° out of phase with each other as the outputs of the detector for the purpose of direction discrimination. However, there may occur also a case where the mutual phase is deviated from 90° due to temperature fluctuations or the like and becomes $(90+\phi)°$ ($|\phi|<90$). The following embodiment is a device which can effect accurate divisional reading even in such a case.

Figure 8:
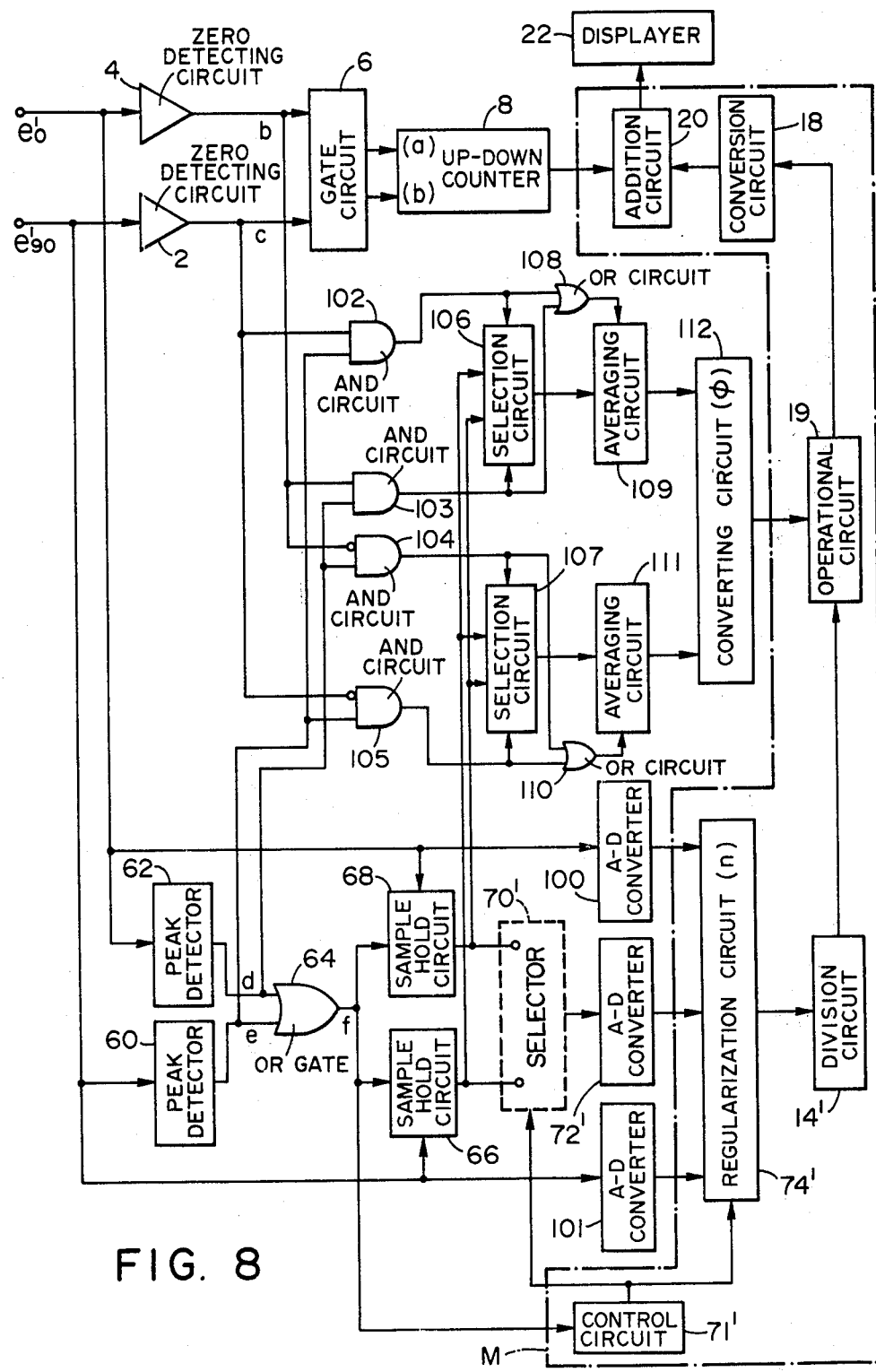
FIG. 8 is a block diagram showing a fourth embodiment of the device according to the present invention which can effect divisional reading accurately even when two sine signals create phase fluctuations in addition to amplitude fluctuations.
Figure 9A:
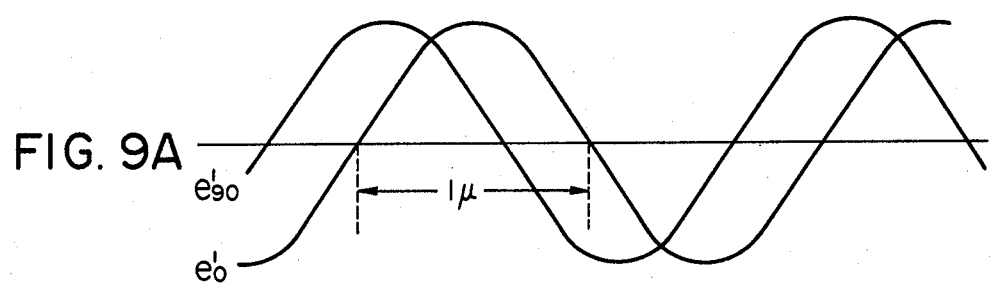
FIGS. 9A–9J illustrate the waveforms appearing in various portions of the block diagram of FIG. 8.
Figure 9B:
Figure 9C:

In FIG. 8, zero detecting circuits 2 and 4 are for receiving as inputs two sine voltages $e'_0$ and $e'_{90}$ obtained from said detectors (as shown in FIG. 9A, where $e'_{90}$ is a sine voltage advanced in phase by $(90+\phi)°$ with respect to $e'_0$) and for waveform-shaping these sine voltages into rectangular voltages (shown in FIGS. 9B and 9C) with O volts as the standard. A gate circuit 6 forms a pulse at the rising and falling edges of the rectangular voltage (shown in FIG. 9C) corresponding to the voltage $e'_0$, determines the direction of movement of the main scale of the encoder from the relation between the two rectangular voltages corresponding to the voltages $e'_0$ and $e'_{90}$, outputs a pulse at a terminal connected to the up input (a) of an up-down counter 8 when the movement of the main scale is in the positive direction, and outputs a pulse at a terminal connected to the down input (b) of the up-down counter when the movement of the main scale is in the reverse direction. Accordingly, the number of pulses counted by the counter 8 corresponds to the displacement of the main scale from its initial position. Also, assuming that design is made such that one-half period 180° of the voltage $e'_0$ corresponds to 1$\mu$ on the main scale, it will be seen from the count content n of the counter 8 that the displacement of the main scale is n$\mu$. Such a construction has already been described with reference to FIG. 1.

Figure 9D:
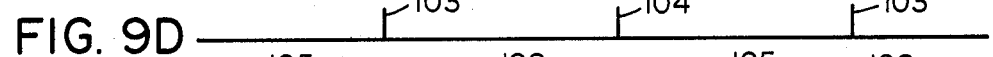
Figure 9E:
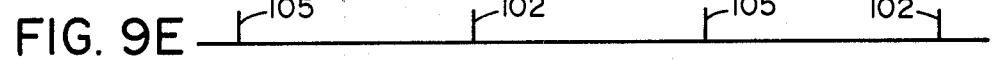
Figure 9F:
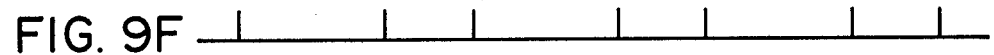
Figure 9G:
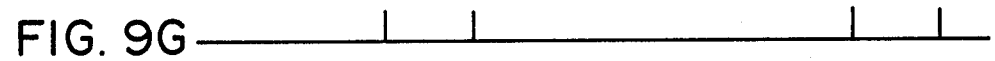
Figure 9H:
Figure 9I:
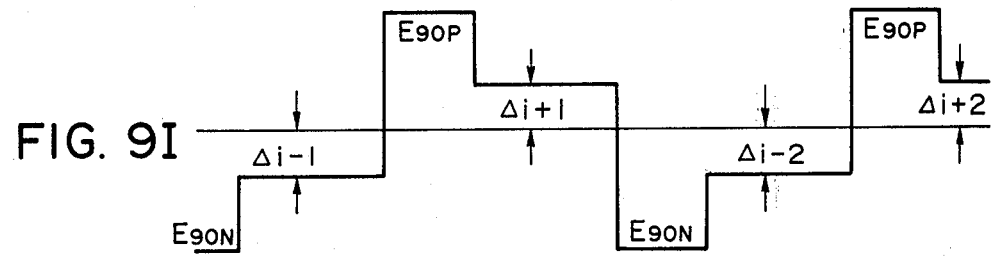
Figure 9J:
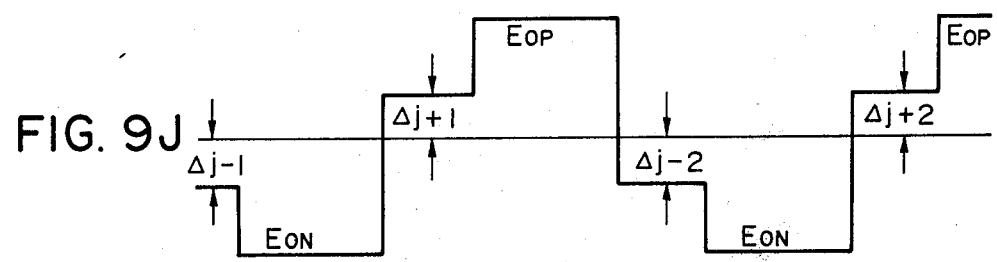

On the other hand, sine voltages $e'_0$ and $e'_{90}$ are applied to A-D converters 100 and 101, respectively, and also to peak detectors 60 and 62, respectively. The peak detector 60 generates a pulse at the peak position of the sine voltage $e'_0$ as shown in FIG. 9E, and the peak detector 62 generates a pulse at the peak position of the sine voltage $e'_{90}$ as shown in FIG. 9D. An OR gate 64 receives as inputs the pulses from the peak detectors 60 and 62 and alternately outputs the two input pulses as shown in FIG. 9F. Sample and hold circuits 66 and 68 hold the values of the sine voltages $e'_0$ and $e'_{90}$, respectively, synchronized with the pulses from the OR gate 64 and therefore, the outputs thereof are such as shown in FIGS. 9J and 9I, which correspond generally to FIGS. 7E and 7F. However, the positive and negative maximum values of the sine voltage $e'_0$ and $E_{OP}$ and $E_{ON}$, respectively, and the positive and negative maximum values of the sine voltages $e'_{90}$ are $E_{90P}$ and $E_{90N}$, respectively. A selector 70' successively applies to an A-D converter 72' the signals from the sample and hold circuits 66 and 68 applied to its two input terminals, in accordance with the control signals from a control circuit 71'. The control circuit 71' receives as inputs the pulses from the OR gate 64, prepares the control signal for the selector 70' following a predetermined procedure, in response to said pulse, and controls the selector 70'. An A-D converter 72' A-D-converts the voltages $E_{OP}$, $E_{ON}$, $E_{90P}$ and $E_{90N}$ successively supplied from the selector 70' to digital signals $E_{DOP}$, $E_{DON}$, $E_{D90P}$ and $E_{D90N}$ corresponding to the magnitudes of the respective signals.

A-D converters 100 and 101 A-D-convert the voltages $e'_0$ and $e'_{90}$ to digital signals $e_{D0}$ and $e_{D90}$ corresponding to the magnitudes of the respective signals.

These digital signals $e_{D0}$, $e_{D90}$, $E_{DOP}$, $E_{DON}$, $E_{D90P}$ and $E_{D90N}$ are applied to a regularization circuit 74'. The regularization circuit 74' discriminates between the types of the applied digital signals $E_{DOP}$, $E_{DON}$, $E_{D90P}$ and $E_{D90N}$ by the control signal from the control circuit 71', regularizes the digital signals $e_{D0}$ and $e_{D90}$ by the operations of the following equations (1) and (2), and successively outputs regularized signals $e'_{D0}$ and $e'_{90}$.

$$e'_{90} = \frac{e_{D0} - \frac{E_{DOP} + E_{DON}}{2}}{\frac{E_{DOP} - E_{DON}}{2}} \quad (1)$$

$$e'_{D90} = \frac{E_{D90} - \frac{E_{D90P} + E_{D90N}}{2}}{\frac{E_{D90P} - E_{D90N}}{2}} \quad (2)$$

The signals $e'_{D0}$ and $e'_{D90}$ obtained by regularizing the digital signals $e_{D0}$ and $e_{D90}$ as described above are free of influences such as amplitude fluctuations in the size of voltages, drift of circuit, etc. As already described in connection FIG. 6, the drift of the circuit can be corrected to some degree by the circuit itself and therefore, equations (1) and (2) may be simplified to the following equations (1)' and (2)':

$$e'_{D0} = \frac{e_{D0}}{\frac{E_{DOP} - E_{DON}}{2}} \quad (1)'$$

$$e'_{D90} = \frac{e_{D90}}{\frac{E_{D90P} - E_{D90N}}{2}} \quad (2)'$$

The signals $e'_{D0}$ and $e'_{D90}$ obtained by the regularization circuit 74' are applied to a division circuit 14', where $e'_{D0}/e'_{D90}$ is calculated. The otput $e'_{D0}/e'_{D90}$ of the division circuit 14' is applied to an operational circuit 19.

Where there is no phase fluctuation, if $\tan^{-1}(e_{D0}/e'_{90})$ is calculated from the output $e'_{D0}/e'_{D90}$ of the division circuit 14', the angle $\theta$ of the signal $e_0$ will be obtained. If this $\theta$ is made to correspond to the amount of movement as shown in FIG. 2, division can be effected substantially without any restriction, but this is based on the premise that the phase difference between the signals $e'_{D0}$ and $e'_{D90}$ is exactly 90° and, if the phase difference is deviated by $\phi$ from 90°, said $\phi$ will also include an error resulting therefrom. The above-described construction is substantially similar to that of FIG. 6, and may be made identical to the latter. Description will now be made of the portion for eliminating the influence of the above-described phase error.

Figure 10:
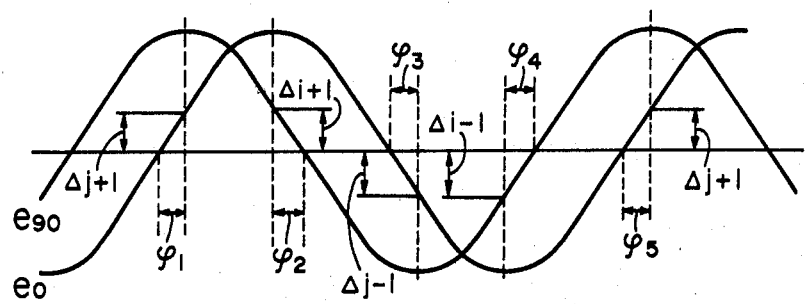
FIG. 10 illustrates the principles on which phase error is eliminated in the block diagram of FIG. 8.

Reference characters 102–112 designate an example of the circuit for obtaining the phase error $\phi$ between two signals. The AND circuit 102 outputs the AND signal of the rectangular voltage of zero detecting circuit 2 (FIG. 9C) and the output pulse of the peak detector circuit 60 (FIG. 9E). The AND circuit 103 outputs the AND signal of the rectangular voltage of zero detecting circuit (FIG. 9B) and the output pulse of the peak detector circuit 62 (FIG. 9D). The AND circuit 104 outputs the AND signal of the inverted voltage of the rectangular voltage of the zero detecting circuit 4 (FIG. 9B) and the output pulse of the peak detector circuit 62 (FIG. 9D). The AND circuit 105 outputs the AND signal of the inverted voltage of the rectangular voltage of the zero detecting circuit 2 (FIG. 9C) and the output pulse of the peak detector circuit 60 (FIG. 9E). The selection circuit 106 receives as inputs the output signals of the sample and hold circuits 66 and 68 (FIGS. 9J and 9I), and outputs the output signal of the sample and hold circuit 68 when the AND signal of the AND circuit 102 has been produced, and outputs the output signal of the sample and hold circuit 66 when the AND signal of the AND circuit 103 has been produced. The selection circuit 107 receives as inputs the output signals of the sample and hold circuits 66 and 68 (FIGS. 9J and 9I), and outputs the output signal of the sample and hold circuit 66 when the AND signal of the AND circuit 104 has been produced, and outputs the output signal of the sample and hold circuit 68 when the AND signal of the AND circuit 105 has been produced. Accordingly, the output signal of the selection circuit 106 is the positive error amount $\Delta i+1, \Delta i+2, \ldots ; \Delta j+1, \Delta j=2, \ldots$ of FIGS. 9I and 9J, and the output signal of the selection circuit 107 is the negative error amount $\Delta i-1, \Delta i-2, \ldots ; \Delta j-1, \Delta j-2, \ldots$ of FIGS. 9I and 9J. The above-described error amount $\Delta i+1, \ldots, \Delta i-1, \ldots \Delta j+1, \ldots, \Delta j-1, \ldots$, as shown in FIG. 10, corresponds to the deviation $\phi$ of the phase difference between sine voltages $e_0$ and $e_{90}$ from 90°. That is, in FIG. 10, for example, deviation $\phi_1$ is obtained as $\phi_1=\sin^{-1}(\Delta j+1)$ and at this time, the phase difference between the sine voltages $e_0$ and $e_{90}$ is $90+\phi_1$.

The OR circuit 108 applies the OR signal of the output signals of the AND circuits 102 and 103 (FIG. 9G) to the averaging circuit 109. The averaging circuit 109 successively adds the output signals of the selection circuit 106 and divides the sum by the number of the OR signals from the OR circuit 108 to obtain an average of the same. Accordingly, the output signal of the averaging circuit 109 is the average signal $\Delta ij+$ of the positive error amounts $\Delta i+1, \ldots ; \Delta j+1, \Delta j+2, \ldots$. The OR circuit 110 applies the OR signal of the output signals of the AND circuits 104 and 105 (FIG. 9H) to the averaging circuit 111. The averaging circuit 111 successively adds the output signals of the selection circuit 107 and divides the sum by the number of the OR signals from the OR circuit 110 to obtain an average of the same. Accordingly, the output signal of the averaging circuit 111 is the average signal $\Delta ij-$ of the negative error amounts $\Delta i-1, \Delta i-2, \ldots ; \Delta j-1, \Delta j-2, \ldots$. The converting circuit 112 receives as inputs the output signals $\Delta ij+$ and $\Delta ij-$ of the averaging circuits 109 and 111 and supplies a digital signal corresponding to $$\frac{\Delta ij+ - \Delta ij-}{2} \ (=\phi).$$

That is, the output of the converting circuit 112 is the average value of the phase errors. An operational circuit 19 receives as inputs this digital signal $$\frac{\Delta ij+ - \Delta ij-}{2} \ (=\phi)$$

and the output signal $e'_{D0}/e'_{D90}$ of the previously described division circuit 14', and effects the following operation;

$$\tan^{-1}\left(\frac{n\sin\phi}{1 - n\cos\phi}\right) \quad (3)$$

where $n \equiv e'_{D0}/e'_{D90}$ $$\phi = 90D + \frac{\Delta ij+ - \Delta ij-}{2} = 90D + \phi$$

The meaning of formula (3) is as follows. In FIG. 10, if $e_0=\sin\theta$, $e_{90}=\sin(\theta+\phi')$. Here, if it is assumed that $m=e_0/e_{90}$, then $$m = \frac{\tan\theta}{\tan\theta\cos(\phi') + \sin(\phi')}, \text{ hence } \tan\theta = \frac{m\sin(\phi')}{1 - m\cos(\phi')} \quad (4)$$

and from this equation, $\theta$ is derived as shown by formula (3). In formula (3), m of equation (4) is substituted for by n and the analog value $\phi'$ is substituted for by the digital value $\phi$. The difference between formula (3) and equation (4) is that formula (3) uses a regularized digital signal as the ratio of the amplitudes between two sine waves and formula (3) uses a digital signal with the phase difference between the two sine wave as $\phi$, but formula (3) and equation (4) show the same content. In this manner, it is possible to obtain $\theta$ which does not contain the error resulting from the influence of the phase error $\phi$.

The conversion circuit 18 outputs a signal corresponding to formula (3), which is the output signal of the operational circuit 19, that has been converted in accordance with a preset rounding width depending on the number of ports into which one-half period (180°) of the sine voltage is divided. An addition circuit 20 adds the output of the conversion circuit 18 to the count content of the counter 8 and the sum thereof provides the driving signal for a displayer 22. Accordingly, if the output of the conversion circuit 18 is m($0 \leq m \leq 9$), then $(n+0.1 \text{ m})\mu$ will be displayed by the display circuit. Thus, the reading accuracy has been enhanced by tenths of a unit.

Figure 11A:
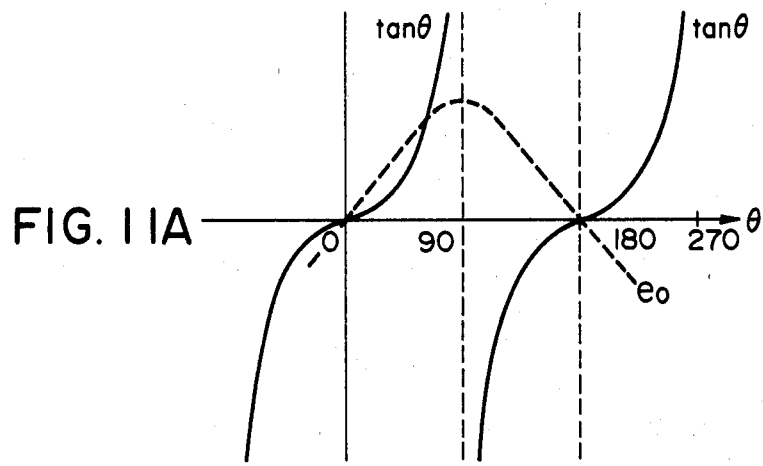
FIGS. 11A and 11B are graphs showing tangent curves used to illustrate a modification of the FIG. 8 embodiment.
Figure 11B:
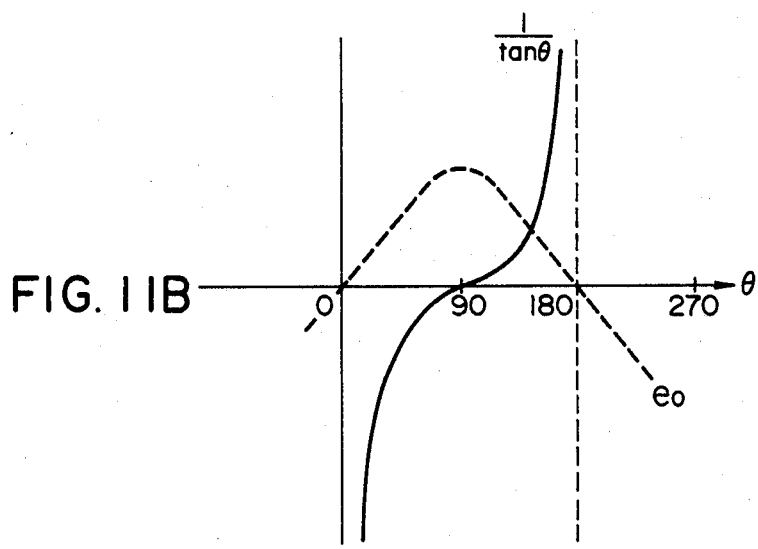

It will be apparent that $e'_{D90}/e'_{D0}$ may be used as n of formula (3). As shown in FIG. 11, it is merely the difference between dividing one-half period corresponding to $\tan\theta$ ($0 \leq \theta \leq 180$) (FIG. 11A) and dividing one-half period corresponding to $(1/\tan\theta)(0 \leq \theta \leq 18)$ (FIG. 11B).

Also, the above-described conversion circuit 18 may be designed such that, as already described, the ratio $$\frac{n\sin\phi}{1 - n\cos\phi}$$

and values 0–9 corresponding to said ratio are stored in mutually corresponding relationship in a ROM and the ratio from the operational circuit is used as the address designation data of ROM.

Also, four memory circuits may be provided in the regularization circuit 74' and a circuit for detecting the frequencies of the voltages $e_0$ and $e_{90}$ may be provided in the control circuit 71'. The design may be made such that the control circuit 71' causes the average values of $E_{DOP}, E_{DON}, E_{D90P}$ and $E_{D90N}$ to be separately stored in said four memory circuits when the frequencies of the voltages $e_0$ and $e_{90}$ are high, and such that the regularization circuit 74' is controlled so as to effect regularization only when the frequencies of the voltages $e_0$ and $e_{90}$ have become small or when these voltages have become DC voltages (in the case of an encoder, the condition in which the main scale is stopped). Of course, the block M may be replaced by a computer.

Further, in the foregoing description, an example in which the amplitude fluctuation and the phase fluctuation are eliminated at the same time in the circuit has been shown. The causes of the two fluctuations differ from each other and therefore, if the amplitude fluctuation is suppressed to some extent by constructing the encoder with accurate lattice spacing and without irregularities of cut lines, it will only be required in terms of the circuit to eliminate the phase fluctuation.

The foregoing description has been made by taking a linear encoder as an example, but the phase fluctuations resulting from temperature changes are conspicuous in rotary encoders. Also therefore, the present invention will be particularly effective if used with rotary encoders.

Also, in the above-described example, the counter 8 is designed to count the pulses generated at the rising and falling edges of the rectangular voltages (FIG. 9C) and these pulses are generated for each 180° and therefore, during that time, $\tan\theta$ (or $1/\tan\theta$) corresponds to $\theta(0\leq\theta\leq180)$ in one to one relationship and no error occurs during the division. But in a case where the counter 8 is designed to count only the pulse generated at the rising edge of the rectangular voltage (FIG. 9C), $\tan\theta$ (or $1/\tan\theta$) is such that $\theta$ corresponding to the same $\tan\theta$ exists in 0°–180° and 180°–360°. That is, for example, in the case of FIG. 11A, there are 90° and 270° as $\theta$ exhibiting $\tan\theta=+\infty$. During the division, these must be distinguished and, for example, when $\theta$ is 0°–180°, the sine voltage $e_0$ is positive and when $\theta$ is 180°–360°, the sine voltage $e_0$ is negative and therefore, if it is arranged that the sign of $e_{90}$ can be applied to the operational circuit, the operational circuit can discriminate between the two due to the difference in sign.

the conversion circuit includes means for converting the ratio of said sine signals to a phase angle, and means for assigning the phase angle a value between 0 and 9 in accordance with the phase angle interval in which it falls.

4. An apparatus according to claim 2, wherein said conversion circuit includes a memory circuit for storing at different locations thereof values that estimate portions of a unit for displacement, and wherein said ratio is employed as an address for accessing the value stored at a location designated by said address.

5. An apparatus according to claim 1 further comprising display means for displaying the measurement from the combining means, and correction means which uses as a reference one of the counted number and the output signal from said converting means and corrects the other thereof in order to correct errors in the display resulting from drifting of the detector and the converting means with respect to one another.

6. An apparatus according to claim 5, wherein said correction means includes memory means for storing the counted number of zero crossings, and control

TABLE I

| ratio $\frac{e_{D0}}{e_{D90}}$ | 0–18 | 18–36 | 36–54 | 54–72 | 72–90 | 90–108 | 108–126 | 126–144 | 144–162 | 162–180 |
|---|---|---|---|---|---|---|---|---|---|---|
| value | 0 | 1 | 2 | 3 | 4 | 5 | 6 | 7 | 8 | 9 |

I claim:

1. An apparatus for increasing the measurement resolution and accuracy of a position measuring device of the type that employs a detector that provides first and second voltages which vary as sine signals in accordance with the displacement of an object from a predetermined position, the sine signals being 90° out of phase with each other, and that determines the displacement of the object from the predetermined position by counting the number of zero crossings of one of said sine signals, each zero crossing corresponding to a unit of displacement, comprising:
   converting means for forming the ratio of said sine signals and for converting the ratio to an output signal representative of a portion of a unit of displacement; and
   means for combining a signal corresponding to the number of zero crossings obtained by said counting with said signal representative of a portion of a unit of displacement to provide a measurement of displacement that includes the number of units of displacement and a portion of a unit of displacement.

2. An apparatus according to claim 1, wherein said converting means includes an A-D converter circuit for converting said sine signals to digital values, a division circuit for forming the ratio of the digital values, and a conversion circuit for comparing the value of said ratio with a plurality of different value intervals that correspond to different portions of a unit of displacement and for assigning the ratio a value, determined by the value interval in which the ratio value falls, that estimates the portion of a unit of displacement that the ratio represents.

3. An apparatus according to claim 2, wherein each 180° half-period of said one sine signal corresponds to a unit of displacement and said value intervals correspond to 18° phase angle intervals such that each interval represents one-tenth of a half-period, the intervals being successively assigned the values of 0 to 9, and wherein means for correcting the number stored in said memory means by combining the output signal of said converting means with signals corresponding to the zero crossings of said sine signals to provide an adjustment value for the stored number.

7. An apparatus according to claim 1, 5 or 6, wherein said converting means includes peak detecting means for producing output signals corresponding to the peak-to-peak values of each of said sine signals, regularization means for receiving the output signals from said peak detecting means and said sine signals and for providing output signals corresponding to said sine signals that are free of amplitude fluctuations caused by drifting of the detector with respect to the converting means, and wherein said ratio is the ratio of the output signals from the regularization means.

8. An apparatus according to claim 1, 5 or 6, wherein the converting means includes peak detecting means for producing output signals corresponding to the peak-to-peak values of each of said sine signals, average value means for determining the average value of each of the sine signals, subtraction means for subtracting the average value of each sine signal from its corresponding sine signal to provide a pair of subtraction signals, output means for receiving the output signals from said peak detecting means and the subtraction signals from said subtraction means and for providing output signals corresponding to said sine signals that are free of amplitude fluctuations caused by drifting of the detector with respect to the converting means, said ratio being formed with the output signals from the output means.

9. An apparatus for increasing the measurement resolution and accuracy of a position measuring device of the type that employs a detector that provides first and second voltages which vary as sine signals in accordance with the displacement of an object from a predetermined position, the sine signals being 90° out of phase with each other, and that determines displacement from the predetermined position by counting the number of zero crossings of one of said sine signals, each zero crossing corresponding to a unit of displacement, comprising:

division means for forming the ratio (n) of said sine signals;

phase difference detecting means for receiving said sine signals and for determining the phase deviation ($\phi$) from 90° of the phase between the sine signals;

operational means for providing an output signal corresponding to $$\frac{n\sin\phi}{1 - n\cos\phi},$$

said output signal corresponding to a portion of a unit of displacement; and means for adding the value of the measurement of displacement determined by counting zero crossings and the value of the output signal from the operational means corresponding to a portion of a unit of displacement to provide a measurement of displacement that includes the number of units of displacement and a portion of a unit of displacement.

* * * * *